United States Patent [19]
Sturzebecher et al.

[11] Patent Number: 5,801,476
[45] Date of Patent: Sep. 1, 1998

[54] THICKNESS MODE ACOUSTIC WAVE RESONATOR

[75] Inventors: Dana J. Sturzebecher, Mullica; John A. Kosinski, Wall; Arthur Ballato, Oceanport; Paul W. Cooke, Hazlet; Hong-Liang Cui, Hoboken, all of N.J.

[73] Assignee: The United States of America as represented by the Secretary of the Army, Washington, D.C.

[21] Appl. No.: 694,890

[22] Filed: Aug. 9, 1996

[51] Int. Cl.$^6$ ................................................ H01L 41/08
[52] U.S. Cl. .................... 310/324; 310/320; 310/361; 333/193
[58] Field of Search ................................. 310/322, 324, 310/366, 361, 320; 333/133, 187–194

[56] References Cited

U.S. PATENT DOCUMENTS

| | | | |
|---|---|---|---|
| 4,502,932 | 3/1985 | Kline et al. | 310/320 X |
| 5,075,641 | 12/1991 | Weber et al. | 310/324 X |
| 5,166,646 | 11/1992 | Avanic et al. | 333/193 X |
| 5,185,589 | 2/1993 | Krishnaswamy et al. | 333/133 |
| 5,233,259 | 8/1993 | Krishnaswamy et al. | 310/324 |
| 5,446,306 | 8/1995 | Stokes et al. | 310/324 X |
| 5,552,655 | 9/1996 | Stokes et al. | 310/324 X |

OTHER PUBLICATIONS

Temperature Compensated High Coupling and High Quality Factor ZnO/SiO$_2$ Bulk Wave Resonators on High Resistance Substrates, by Shiosaki et al, IEEE Ultrasonics Symposium, 1984, pp. 405–410.

Acoustic Bulk Wave Composite Resonators, by Larkin et al, Appl. Phys. Lett 38(3), Feb. 1, 1981, pp. 125–127.

*Primary Examiner*—Mark O. Budd
*Attorney, Agent, or Firm*—Michael Zelenka; John M. O'Meara

[57] ABSTRACT

The invention is directed to resonators and more particularly to an MMIC-compatible resonator which can be fabricated on an MMIC chip using MMIC processing techniques. The MMIC-compatible resonator has a substrate approximately 100 microns thick made of semi-insulating GaAs and/or AlGaAs. The substrate flanks an air via on which is fabricated a thin film piezoelectric semi-insulating GaAs film, comprising the piezoelectrically active element. The piezoelectrically active element is flanked either laterally or from the top to bottom thereof by a pair of electrodes which serve to excite the thickness shear or thickness extensional mode of the thin film piezoelectrically active element. There are a number of III-V and II-VI binary compounds and ternary, and other piezoelectric semiconductor alloys, which can be used for the purposes of the invention. The thin film measures approximately 5 microns or less in thickness and is fabricated on the semi-insulating GaAs, on the [110], [111] or [100] axis thereof.

16 Claims, 3 Drawing Sheets

THICKNESS MODE ACOUSTIC WAVE RESONATOR

GOVERNMENT INTEREST

The invention described herein may be manufactured, used, imported and licensed by or for the Government of the United States of America without the payment to us of any royalties thereon.

FIELD OF THE INVENTION

This invention relates to resonators and more particularly to a monolithic microwave integrated circuit (MMIC)-compatible resonator which can be fabricated on an MMIC chip using MMIC processing techniques.

BACKGROUND OF THE INVENTION

Heretofore, a multitude of varying microwave/millimeter wave (MW/MMW) oscillators, filters, monolithic microwave integrated circuits (MMICs), resonators, phase lock loops and clock recovery circuits have been generally known to those skilled in the art. Despite the obvious advantages of these known devices, the prior art has thus far failed to provide to the trade a small size, compact, and MMIC compatible resonator having fundamental mode operation and high Q at MW/MMW frequencies. The present invention addresses this need.

SUMMARY OF THE INVENTION

Accordingly, it is an object of the present invention to provide such a small size, compact and MMIC compatible resonator having fundamental mode operation and high Q at MW/MMW frequencies.

It is a further object of the invention to provide a device which enables the fabrication of stable MW/MMW clock circuits.

It is a further object of the invention to provide an MMIC-compatible resonator which can be fabricated on an MMIC chip using MMIC processing techniques.

It is yet another object of the present invention to provide a method of reducing phase noise at the millimeter wave length by establishing high Q and tunable resonators, by providing monolithic bulk acoustic wave resonators that have fundamental operation at the MW/MMW frequencies.

A still further object of the present invention is to provide high quality factor resonators, tunable resonators, and stack filters for use in low phase noise oscillators, such as in high Q oscillators, as well as in tunable oscillators. Other applications include the provision of high frequency clock circuits.

The foregoing and other objects of the present invention are realized through the provision of a fundamental mode, high Q, MMIC-compatible monolithic resonator on a MMIC circuit, such as an oscillator. As a result of the invention, substantial size reduction can be obtained in: the size of the circuit, the size of the resonator, in some cases the resonator cavity, as well as in the hardware for the multiplication of a low frequency high Q resonant oscillator. Another advantage of the invention is that the circuit is contained on a single monolithic chip. The resonator is MMIC fabrication-compatible. It has a controllable resonant frequency due to layer growth and can be tuned via an external voltage for a VCO application.

Essentially, the invention comprises a monolithic microwave integrated circuit, i.e. a semiconductor device, which includes a substrate and an air via, wherein the substrate flanks the air via. A piezoelectrically active, thin film region is located above the air via and includes a piezoelectrically active element. A pair of electrodes flank the piezoelectrically active element and are designed to carry a signal which excites the piezoelectrically active element. A gold transmission line disposed over the substrate carries a signal to the electrodes, preferably through transmission lines which are implanted in the piezoelectrically active, thin film region.

The electrodes can flank the piezoelectrically active element by being disposed above and below it, relative to the thickness dimension of the piezoelectrically active element or, alternatively, the electrodes can flank the piezoelectrically active element laterally, in either case exciting a thickness shear or a thickness extensional mode of the active element. The semiconductor device has an overall thickness on the order of about 100 microns, in contrast to the piezoelectrically active thin film region which has a thickness of 5 microns or less. The piezoelectrically active element can be fabricated as a component of an oscillator, filter, monolithic microwave integrated circuit, phase lock loop, a clock recovery circuit or the like, or as a discrete resonator.

BRIEF DESCRIPTION OF THE DRAWINGS

Other features and advantages of the present invention will become apparent from the following Detailed Description of the Invention which refers to the accompanying drawings wherein.

DETAILED DESCRIPTION OF THE DRAWINGS

The invention is directed to a semiconductor device which can be a III-V compound, a II-VI compound, or any other piezoelectric material or alloy. The preferred embodiment of the device architecture involves fabricating the same as a semi-insulating GaAs thin film on GaAs or AlGaAs substrate. The film orientation is preferably either along the [110] or the [111] crystal axis. The device is approximately 100 microns thick, so as to be MMIC compatible. However, the piezoelectrically active thin film (one or several layers stacked together) is 5 microns or thinner. The device's piezoelectrically active area edge is beveled for maximum Q and minimum spurious noise performance.

Figure 1:
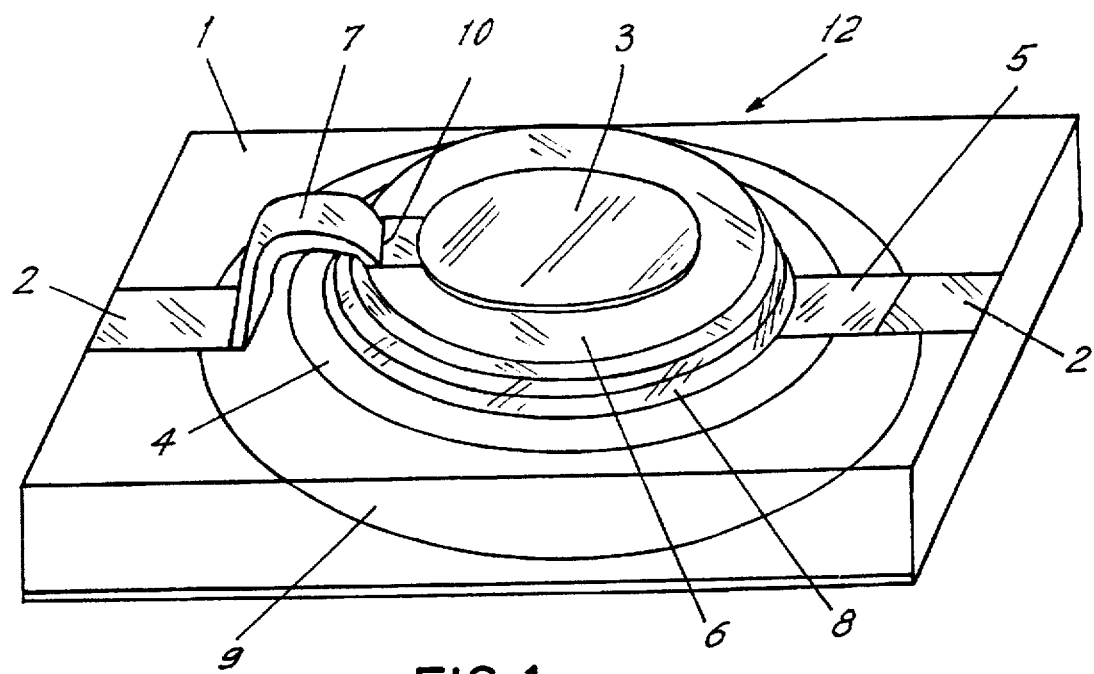
FIG. 1 is a perspective of a single layer thickness field bulk acoustic wave resonator.

With reference to FIG. 1, the single layer device 12 is fabricated on a semi-insulating GaAs substrate 1, of the [110] or [111] orientation. The substrate 9 is approximately 100 microns thick, so as to be MMIC compatible. On top of the substrate 1 is a gold transmission line 2 of 50 ohm characteristic impedance leading into the piezoelectrically active region 4 of the chip, which is located over the substrate 1. The gold transmission line extends only up to the thin film region 4 of the device 12. The 50 ohm gold transmission line 2 connects to implanted n+ GaAs transmission lines 5 and 10 which carry the signal in the thin film region of the device to the upper and lower electrodes 3 and 8, respectively. The connection to the top n+ transmission line 10 is made via an airbridge 7. The piezoelectrically active area of the device 12 is located between electrodes 3 and 8 in the vertical direction. The piezoelectric material 6 therefore exists between the electrodes 3 and 8.

The piezoelectrically active area, electrodes 3 and 8, and implanted transmission lines 5 and 10 are disposed over the air via which enables the thin film structure 9. The bottom of the device has a ground plane 11, except under the air via underlying the thin film structure 9. The air via is formed by etching the semi-insulating GaAs until reaching an etch stop layer grown by molecular beam epitaxy (MBE), or other techniques. The electrical connection to the top of the resonator, i.e. the active part of the chip, is from the gold transmission line 2, via the aforementioned gold airbridge 7.

Figure 2:
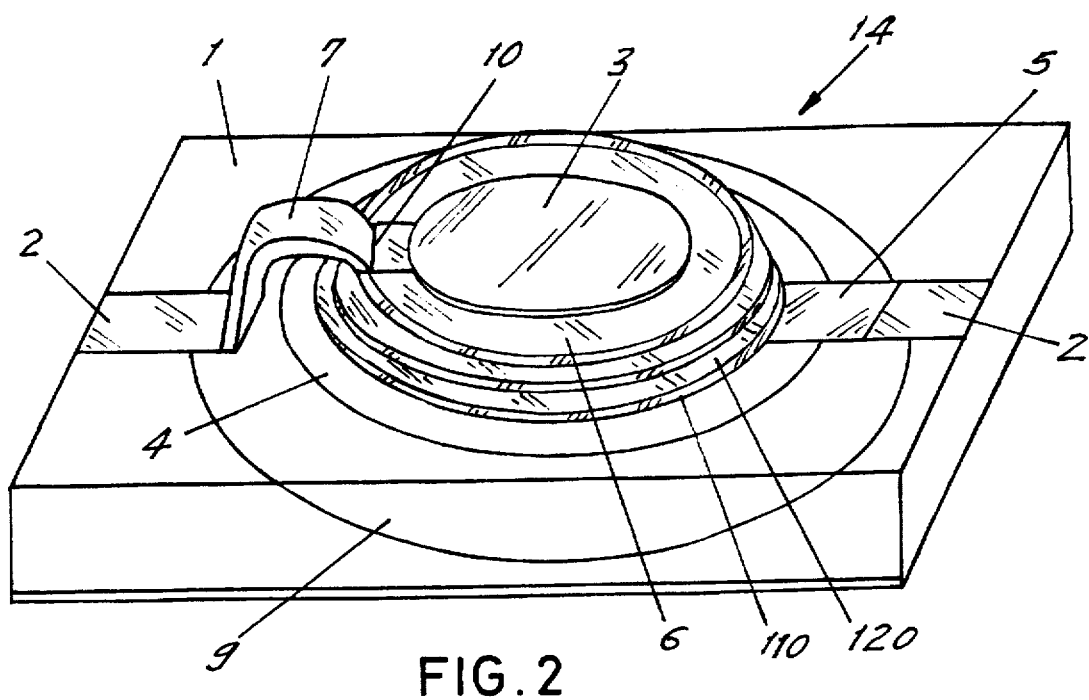
FIG. 2 is a perspective of a stack or multiple-layered thickness field bulk acoustic wave resonator.

FIG. 2 illustrates a substantially similar multi-layer device 14 which is fabricated on a semi-insulating GaAs substrate layer 1, preferably on the [110] or [111] axis. As before, the substrate 9 is approximately 100 microns thick, so as to be MMIC compatible. On top of the device are gold transmission lines 2 of 50 ohm characteristic impedance leading into the piezoelectrically active region (the resonator) of the chip. The gold transmission lines 2 extend only up to the thin film region of the device 14. The 50 ohm gold transmission lines connect to implanted n+ GaAs transmission lines 5 and 10 which carry the signal in the thin film region of the device to the upper electrode 3 and lower electrode 110. The connection to the top n+ transmission line 10 is made via an airbridge 7. The piezoelectrically active area of the device 14 is located between the multiple electrode/piezoelectric material stacked layers in the vertical direction.

The piezoelectric materials 6 and 120 extend between the electrodes 3 and 110. The piezoelectrically active area, the electrodes 3 and 110 and implanted transmission lines 5 and 10 are disposed over the air via, which enables the thin film structure 8. The bottom of the device has a ground plane 11, except under the air via. The air via is formed by etching the semi-insulting GaAs until reaching an etch stop layer grown by MBE, or other technique. Connection is made to the top of the resonator from the gold transmission line by a gold airbridge 7.

In operation, the acoustic resonator of FIG. 1 or FIG. 2 functions by reacting to an electric field generated between the upper and lower electrodes. The electric field excites several modes in the case of the [111] substrate orientation. The highest frequency of operation is given by the longitudinal mode, which is governed by:

$$f_n = (n/2t)\sqrt{[(C_{11}+2C_{12}+4C_{44})/3\rho]} = 2.755 \ n/t \ (\text{MHz}^*\text{mm});$$

where n is the harmonic number, t is the film thickness in mm, and ρ is the density.

For [110] substrate orientation, the corresponding resonance frequency (longitudinal mode, thickness field excitation) is given by:

$$f_n = (n/2t)\sqrt{[(C_{11}+C_{12}+2C_{44})/\rho]} = 5.2 \ n/t \ (\text{MHz}^*\text{mm}).$$

Thus, for a [110] film of 5 μm thickness, the fundamental frequency will be 1.04 GHz, and for a [110] film 1 μm thick, the fundamental frequency will be 5.2 GHz, using the second equation above. Note that for the multiple-layer structure (FIG. 2), a single layer thickness of 0.1 μm or lower is readily achievable, which leads to a fundamental resonance frequency in excess of 50 GHz.

Figure 5:
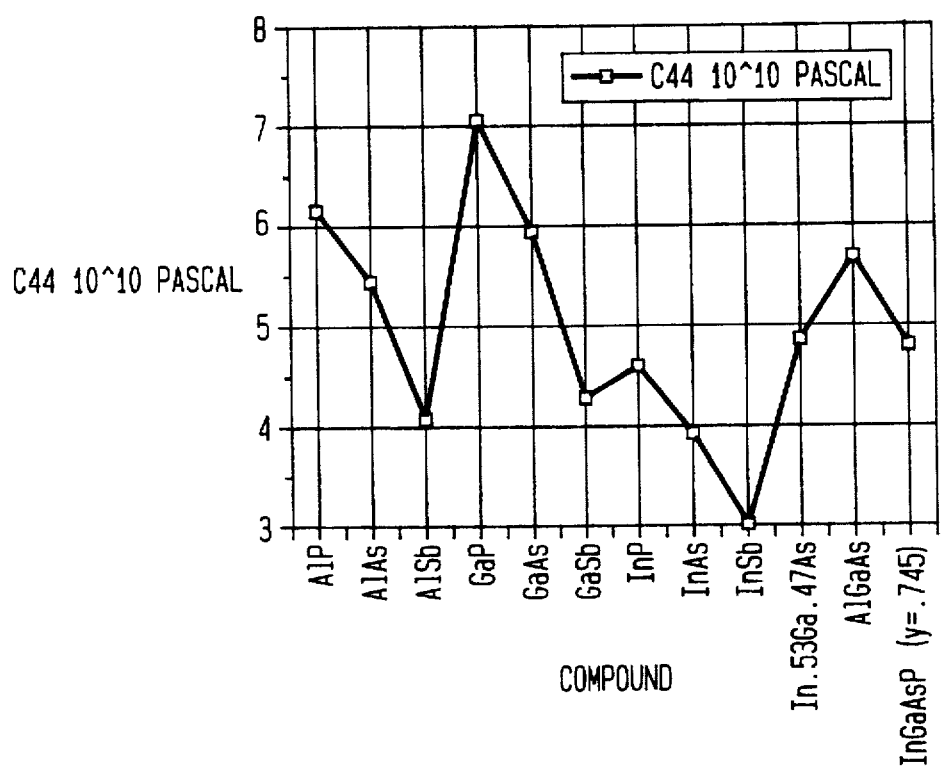
FIG. 5 lists in table format a number of III-V and II-VI binary and ternary compounds, and other piezoelectric semiconductor alloys, which can be used with the invention.

A number of III-V and II-VI binary and ternary compounds, and other piezoelectric semiconductor alloys, which can be used for the purposes of the present invention, are disclosed in FIG. 5.

Thus, in a novel manner, the present invention realizes the fabrication of a thin film structure on GaAs/III-V or II-VI compounds, instead of using quartz, zinc oxide, or aluminum nitride. The invention uses the piezoelectric properties of the [110] and/or [111] substrate of class III-V semiconductors for a piezoelectrically active device, instead of a thin film overlay structure. And in a previously unknown manner, the invention realizes an MMIC-compatible device structure. The use of very thin semiconductor electrodes obviates electrode mass-loading (which decreases the Q and has other disadvantages).

Use of the fundamental mode (film thickness being one-half an acoustic wavelength) maximizes the piezoelectric coupling (compared to harmonic mode operation). The effective coupling decreases as the square of the harmonic number, so, for example, the third harmonic has only (⅑) or about 11% of the coupling on the fundamental. Limitation to the fundamental mode permits useful operation at microwave frequencies, but necessitates careful control of the manufacturing processes to assure flatness and parallelism, so that one has clean mode spectra, i.e., the graphs of resonator admittance versus frequency have sharply resonant single peaks, uncluttered by auxiliary resonances adjacent to the desired resonant peaks, leading to interference in operation.

Figure 3:
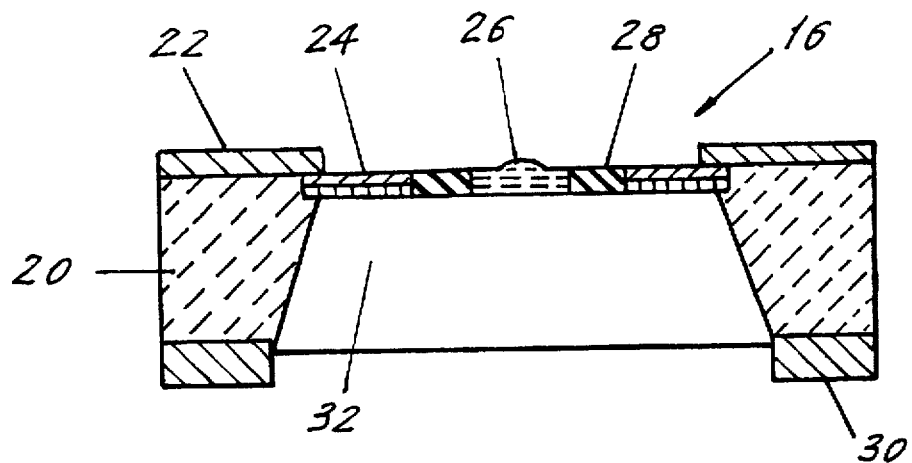
FIG. 3 is a cross section through a lateral field device of the present invention.
Figure 4:
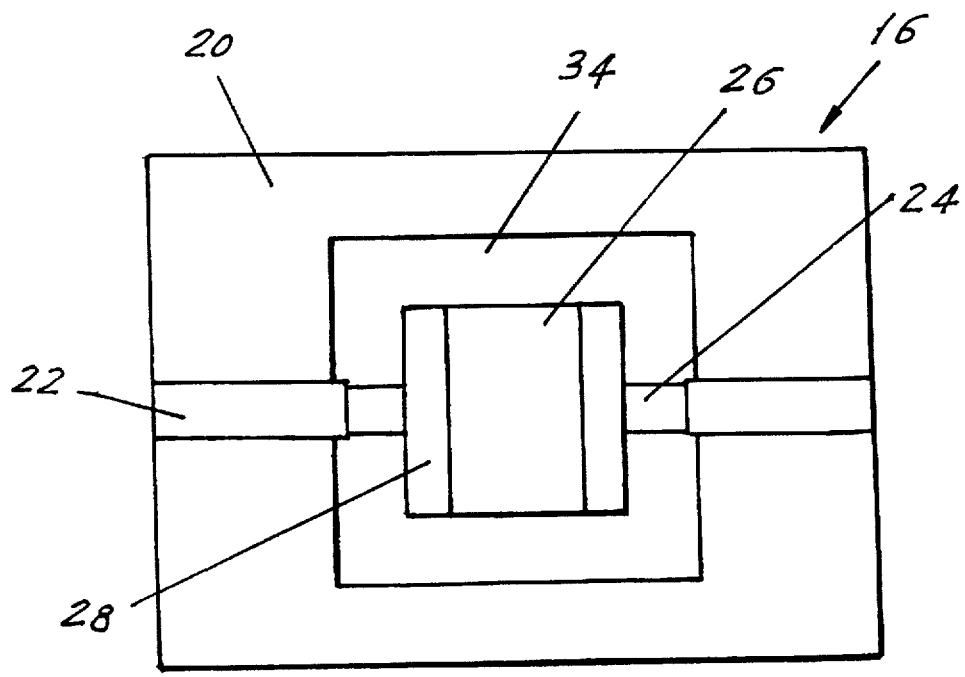
FIG. 4 is a top view of the device of FIG. 3.

In the alternate embodiment of the invention shown in FIGS. 3 and 4, the semiconductor device 16 can be a III-IV compound, II-VI compound, or any other piezoelectric material, or alloy. The device architecture is fabricated on semi-insulating III-V compound such as a GaAs substrate 20 whose major surfaces are perpendicular to a certain crystal axis, such as the [100] axis. The device's active area or resonance structure 26 is a contoured, trapped-energy bulk wave resonator using the lateral-field excitation of the preferred [100] orientation of GaAs.

Preferably, the substrate 20 is approximately 100 microns thick, so as to be MMIC compatible, with a piezoelectrically active area thin film thickness of less than 5 microns. On top of the device 16 is a gold transmission line 22 of 50 ohm characteristic impedance leading into the active region of the chip. The gold transmission line 22 only extends up to the thin film region of the device which is constituted of the region 34 (FIG. 4). The gold transmission line 22 connect to an implanted n+ GaAs transmission line 24 which carries the signal in the thin film region of the device to the electrodes 28. The piezoelectrically active area 26 of the device 16 is located between the electrodes 28, and is exposed to the driving electric field, which exists between these electrodes, in a lateral direction relative to the film thickness. The piezoelectrically active area 26, electrodes 28 and implanted transmission lines 24 are located over the air via 32, which enables the thin film structure to be excited piezoelectrically. The bottom of the device 16 has a ground plane 30, except under the air via 32.

Unlike the previously described devices 12 and 14 which are excited vertically, the acoustic resonator device 16 of FIGS. 3 and 4 is excited laterally by the pair of electrodes 28 which are located on either side of the thin active film 26. This produces excitation of the thickness shear or thickness extensional mode of the film. The signal is coupled out of the resonator device 16 through the transmission lines 24.

The operation at any harmonic mode produces a frequency, $f_n$, where $f_n = (n/2t)\sqrt{(C^*/\rho)}$, and where n is the overtone number, t is the film thickness, ρ is the mass density and $\bar{C}$ is the effective stiffness constant of the particular mode excited. To increase the operational frequency, one can decrease the thickness t of the piezoelectrically active area. As an example, for a GaAs active area, the fundamental frequency is given by f=1.671/t (MHz*mm). Therefore, for t equals 5 micrometers, f equals 340 MHz. For t of 1 micrometer, f equals to 1.7 GHz. One of the advantages of using lateral field excitation is that there is no direct contact between the electrodes and the vibrating region, which leads to decreased damping and hence an increased quality factor of the resonator.

As before, there are a number of III-V and II-VI binary compounds and ternary, and other piezoelectric semiconductor alloys, which can be used for the device of the present invention. These materials are listed in FIG. 5.

Novel aspects of the device 16 include the provision of the thin film structure on GaAs/III-IV or II-VI compounds instead using quartz, zinc oxide, or aluminum nitride. Similarly, the use of the piezoelectric property of the [100] axis of class III-V semiconductors for the piezoelectrically active device, instead of a thin film overlay structure, is believed to be novel. So is the provision of an MMIC-compatible device structure and the implementation of a lateral-field piezoelectric excitation of acoustic modes using implanted n+ electrodes so that electrode mass loading (which decreases the Q and has other disadvantages) is obviated. In addition, using lateral-field excitation (LFE) gives an additional degree of design freedom. This is because it allows the lateral azimuth in the plane in the thin film to be selected so as to optimize one of the resonator properties, for example, to permit operation simultaneously on more than one thickness mode, or to permit discrimination against an unwanted interfering mode.

Use of the fundamental mode (film thickness being one-half an acoustic wavelength) maximizes the piezoelectric coupling (compared to harmonic mode operation). The effect of coupling decreases as the square of the harmonic number, so, for example, the third harmonic has only (1/9) or about 11% of the coupling on the fundamental. Limitation to the fundamental mode permits use for operation at microwave frequencies, although it necessitates careful control of the manufacturing processes to assure flatness and parallelism, so that one has clean mode spectra, i.e. graphs of resonator admittance versus frequency that have sharply resonant single peaks, unclogged by auxiliary resonances adjacent to the desired resonant peaks, leading to interference in operation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A monolithic microwave integrated circuit, semiconductor device, comprising:
   a substrate and an air via, the substrate flanking the air via and being selected from the group of GaAs and AlGaAs;
   a piezoelectrically active, semi-insulating GaAs thin film region located over the air via;
   a piezoelectrically active element in the piezoelectrically active region;
   a pair of electrodes flanking the piezoelectrically active element and effective for carrying a signal which excites the piezoelectrically active element; and
   a transmission line over the substrate for carrying a signal to the electrodes.

2. The semiconductor device of claim 1, in which the semiconductor device has a thickness on the order of about 100 microns and the thin film region has a thickness not greater than about 5 microns.

3. The semiconductor device of claim 1, in which the electrodes flank the piezoelectrically active element by being disposed above and below the same, relative to a thickness dimension of the piezoelectrically active element.

4. The semiconductor device of claim 1, in which the electrodes laterally flank the piezoelectrically active element, in a manner which excites a thickness shear or a thickness extensional mode of the piezoelectrically active element.

5. The semiconductor device of claim 1, in which the piezoelectrically active element is formed as part of an MMIC circuit from the group of: oscillators, filters, monolithic microwave integrated circuits, resonators, phase lock loops and clock recovery circuits.

6. The semiconductor device of claim 1, in which a film orientation of the thin film region is along a [110] crystal axis.

7. The semiconductor device of claim 1, in which a film orientation of the thin film region is along a [111] crystal axis.

8. The semiconductor device of claim 1, in which the thin film region comprises a plurality of layers in the form of a multiple-layer thickness field bulk acoustic wave resonator.

9. The semiconductor device of claim 1, in which the transmission line is a gold transmission line of 50 ohm characteristic impedance which extends only up to the thin film region of the semiconductor device.

10. A monolithic microwave integrated circuit, semiconductor device, comprising:
    a substrate and an air via, the substrate flanking the air via;
    a piezoelectrically active, thin film region located over the air via;
    a piezoelectrically active element in the piezoelectrically active region;
    a pair of electrodes flanking the piezoelectrically active element and effective for carrying a signal which excites the piezoelectrically active element; and
    a gold transmission line of 50 ohm characteristic impedance which extends over the substrate only up to the thin film region of the semiconductor device and connects to an n+ GaAs internal transmission line which carries a signal in the thin film region to the electrodes.

11. The semiconductor device of claim 10, further comprising an airbridge transmission line between the transmission line and the n+ GaAs transmission line.

12. The semiconductor device of claim 11, further including a ground plane on a bottom side of the substrate.

13. The semiconductor device of claim 1, in which the air via is formed by etching the semi-insulating GaAs until reaching an etch stop layer.

14. The semiconductor device of claim 1, in which the semiconductor device is constructed to have a fundamental frequency on the order of 1 GHz when a thickness of the thin film region is about 5 microns and a fundamental frequency of about 5 GHz when the thin film region has a thickness of about 1 micron.

15. The semiconductor device of claim 1, in which the thin film region has a thickness on the order of about 0.1 microns and a fundamental resonance frequency in excess of 50 GHz.

16. The semiconductor device of claim 1, in which the substrate is fabricated of a material selected from the group of: AlP, AlAs, AlSb, GaP, GaAs, GaSb, InP, InAs, InSb, In.53Ga.47As, AlGaAs, InGaAspIP and alloys thereof.

* * * * *